United States Patent
Lee et al.

(10) Patent No.: US 8,912,085 B1
(45) Date of Patent: Dec. 16, 2014

(54) METHOD AND APPARATUS FOR ADJUSTING THRESHOLD VOLTAGE IN A REPLACEMENT METAL GATE INTEGRATION

(71) Applicant: GlobalFoundries Inc., Grand Cayman (KY)

(72) Inventors: Bongki Lee, Malta, NY (US); Bharat V. Krishnan, Clifton Park, NY (US); Jinping Liu, Hopewell Junction, NY (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 14/017,409

(22) Filed: Sep. 4, 2013

(51) Int. Cl.
| | | |
|---|---|---|
| H01L 21/3205 | (2006.01) | |
| H01L 21/02 | (2006.01) | |
| H01L 29/49 | (2006.01) | |
| H01L 21/283 | (2006.01) | |
| H01L 21/8238 | (2006.01) | |

(52) U.S. Cl.
CPC .............. *H01L 29/49* (2013.01); *H01L 21/283* (2013.01); *H01L 29/4966* (2013.01); *H01L 21/823842* (2013.01)

USPC .......................................... 438/585; 257/411

(58) Field of Classification Search
CPC ............... H01L 21/823842; H01L 21/823857; H01L 21/28185; H01L 21/823864; H01L 29/4966; H01L 29/66545; H01L 29/7833
USPC ........... 257/269, 411, 410; 438/585, 586, 592
See application file for complete search history.

(56) References Cited

U.S. PATENT DOCUMENTS

| | | | |
|---|---|---|---|
| 2009/0152650 A1* | 6/2009 | Chudzik et al. | 257/410 |
| 2012/0326243 A1* | 12/2012 | Huang et al. | 257/410 |
| 2013/0082332 A1* | 4/2013 | Liu et al. | 257/369 |

* cited by examiner

*Primary Examiner* — Nikolay Yushin
(74) *Attorney, Agent, or Firm* — Ditthavong & Steiner, P.C.

(57) ABSTRACT

A methodology for enabling a gate stack integration process that provides additional threshold voltage margin without sacrificing gate reliability and the resulting device are disclosed. Embodiments include conformally forming a margin adjusting layer in a gate trench, forming a metal capping layer on the margin adjusting layer, and forming an n-type work function (nWF) metal layer on the metal capping layer.

17 Claims, 4 Drawing Sheets

US 8,912,085 B1

METHOD AND APPARATUS FOR ADJUSTING THRESHOLD VOLTAGE IN A REPLACEMENT METAL GATE INTEGRATION

TECHNICAL FIELD

The present disclosure relates to a replacement metal gate (RMG) process for threshold voltage adjustment. The present disclosure is particularly applicable to n-type and p-type field effect transistors (N/P-FET) for 20 nanometer (nm) technology nodes and beyond.

BACKGROUND

A gate stack integration according to a current RMG process is illustrated in FIGS. 1A through 1D. FIG. 1A illustrates the formation of an interface layer (IL) and a high-K (HK) dielectric layer in both N-FET and P-FET gate trenches 101 and 103, respectively, on a substrate 100. Adverting to FIG. 1B, a p-type work function (pWF) metal layer 105 (e.g., titanium nitride (TiN)) is deposited. Next, as illustrated in FIG. 1C, the pWF metal layer 105 is selectively removed from the N-FET devices by a patterning and etch process. Adverting to FIG. 1D, an n-type work function (nWF) metal layer 107 is deposited on both N-FET and P-FET device gate trenches and a gate metal 109 (e.g., aluminum (Al)) is deposited.

For 20 nm and beyond technology nodes, the threshold voltage ($V_{th}$) is adjusted by Al diffusion to the gate stack from the gate metal (e.g., titanium aluminide (TiAl) or Al). However, Al diffusion may also cause high leakage currents to the gate stack resulting in time dependent dielectric breakdown (TDDB). Such leakage currents especially affect N-FET devices. Thus, the utilization of nWF metals to adjust $V_{th}$ has been very selective depending on the subsequent metal layers (e.g., TiN, tantalum nitride (TaN)) in the RMG process and their thickness. Further, RMG processes are made more complicated by the additional metal layers.

A need therefore exists for a methodology enabling reliable threshold voltage adjustment with a simplified post gate (PG) patterning, and the resulting device.

SUMMARY

An aspect of the present disclosure is a method for a simplified RMG process for a gate stack exhibiting additional $V_{th}$ margin and reduced susceptibility to TDDB.

Another aspect of the present disclosure is a gate stack exhibiting additional $V_{th}$ margin and reduced susceptibility to TDDB.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: conformally forming a margin adjusting layer in a first gate trench, forming a metal capping layer on the margin adjusting layer, and forming an nWF metal layer on the metal capping layer.

Aspects of the present disclosure include forming the margin adjusting layer by conformal deposition to a thickness of 4 Angstroms (Å) to 6 Å. Additional aspects include forming the metal capping layer of TiN by a conformal deposition process to a thickness of 10 Å to 12 Å. Further aspects include conformally forming a dielectric layer on a bottom surface and sidewalls of the first gate trench and of a second gate trench, forming a pWF metal layer on the dielectric layer in the first and second gate trenches, removing the pWF metal layer from the first gate trench, and forming the margin adjusting layer on the dielectric layer in the first gate trench. Another aspect includes forming the margin adjusting layer on the pWF metal layer in the second gate trench. Further aspects include filling the first and second gate trenches with a silicon (Si) capping layer to a height of 100 Å to 200 Å above the gate trench, annealing the Si capping layer, and subsequently removing the annealed silicon capping layer. Additional aspects include forming the nWF metal layer of an nWF material and forming the margin adjusting layer of lanthanum oxide ($La_2O_3$).

Another aspect of the present disclosure is a device including: a margin adjusting layer conformally formed in a first gate trench of an RMG, a metal capping layer formed on the margin adjusting layer, and an nWF metal layer formed on the metal capping layer. Additional aspects include the margin adjusting layer having a thickness of 4 Å to 6 Å. Further aspects include the metal capping layer being formed of TiN and having a thickness of 10 Å to 12 Å. Additional aspects include a HK dielectric layer conformally formed on a bottom surface and sidewalls of the first gate trench and of a second gate trench, wherein the margin adjusting layer is formed on the HK dielectric layer of the first gate trench. Another aspect includes a pWF metal layer formed on the HK dielectric layer in the second gate trench, wherein the margin adjusting layer is formed on the pWF metal layer. Further aspects are the nWF metal layer including an nWF material and the margin adjusting layer including $La_2O_3$.

Another aspect includes a method including: forming a HK dielectric layer on the bottom and side surfaces of both N-FET and P-FET gate trenches, forming a pWF metal layer on the HK dielectric layer, removing the pWF metal layer from the N-FET gate trench, conformally forming a margin adjusting layer in the N-FET and P-FET gate trenches, forming a capping layer on the margin adjusting layer, filling the gate trenches with a Si capping layer, annealing the filled N-FET and P-FET gate trenches, subsequently removing the Si capping layer from the N-FET and P-FET gate trenches, and forming an nWF metal layer on the metal capping layer.

Other aspects include forming the margin adjusting layer by conformal deposition to a thickness of 4 Å to 6 Å, forming the metal capping layer of TiN by conformal deposition to a thickness of 10 Å to 12 Å. Further aspects include forming the nWF metal layer of an nWF material, and forming the margin adjusting layer of $La_2O_3$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIGS. 1A through 1D schematically illustrate a gate stack integration according to a conventional RMG process.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of TDDB attendant upon nWF metal diffusion in an N-FET gate stack for 20 nm technology nodes and beyond. In accordance with embodiments of the present disclosure, a La-based margin adjusting layer and metal capping layer are formed prior to the nWF metal layer in the N-FET and P-FET gate trenches.

Methodology in accordance with embodiments of the present disclosure includes conformally forming a margin adjusting layer in a first gate trench; forming a metal capping layer on the margin adjusting layer; and forming an n-type work function (nWF) metal layer on the metal capping layer. Additional aspects include conformally forming a HK dielectric layer and a pWF metal layer in first and second gate trenches; selectively removing the pWF metal layer from the first gate trench; and forming the margin adjusting layer on the HK dielectric layer in the first gate trench Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2F schematically illustrate various process steps for a La-based gate stack integration scheme, in accordance with an exemplary embodiment of the present disclosure.

Figure 1A:
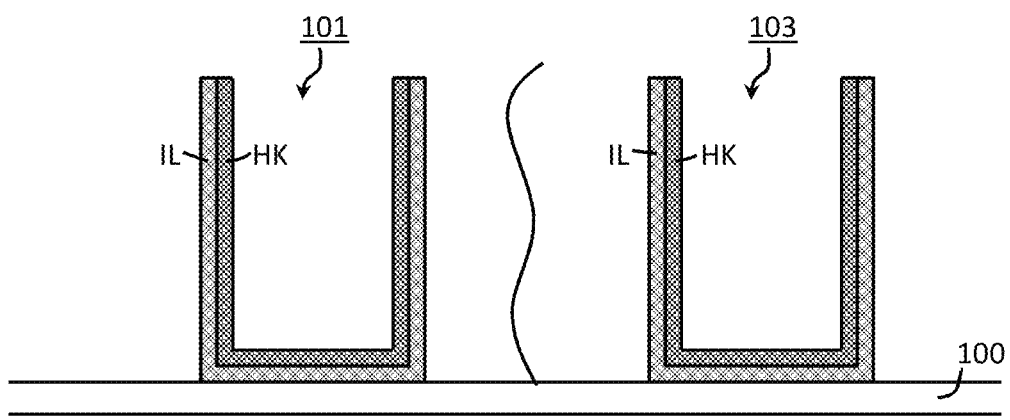
Figure 1B:
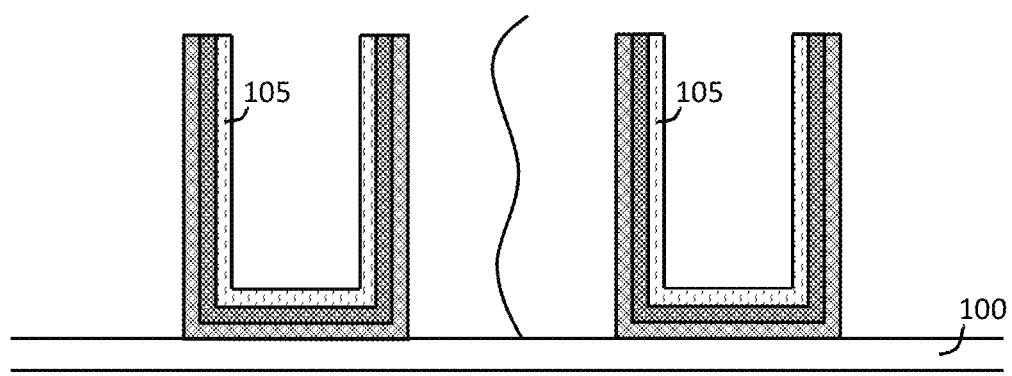
Figure 1C:
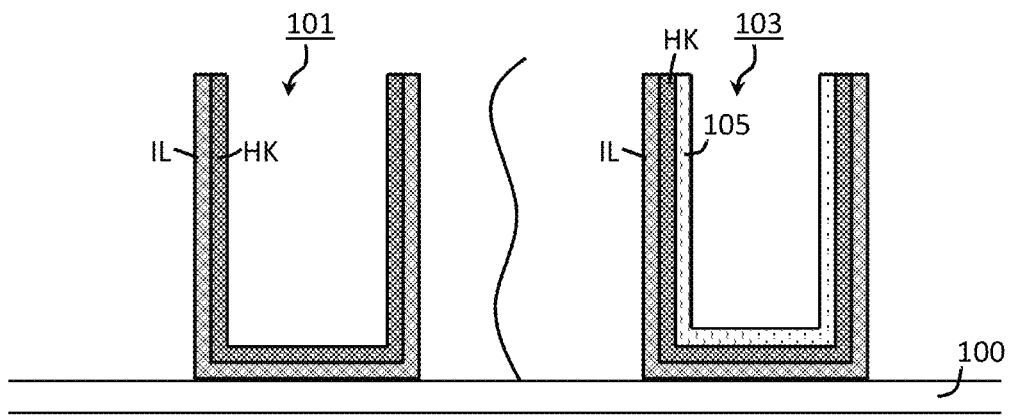
Figure 1D:
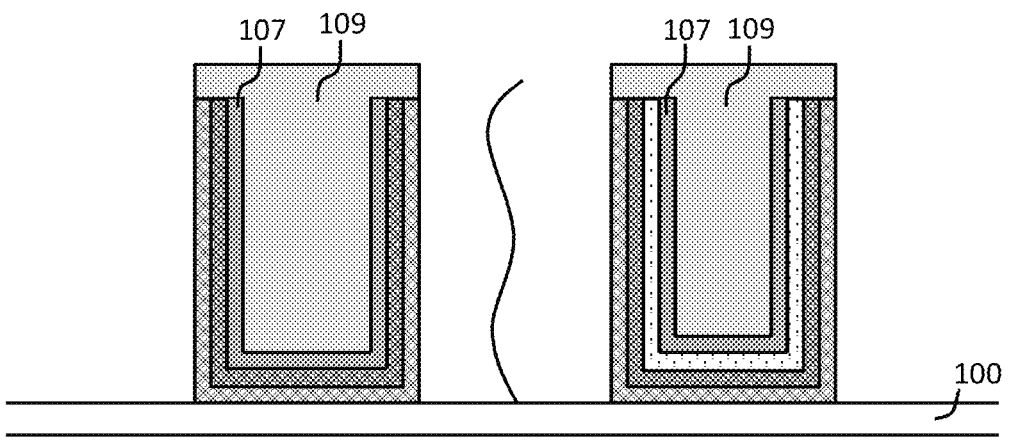
Figure 2A:
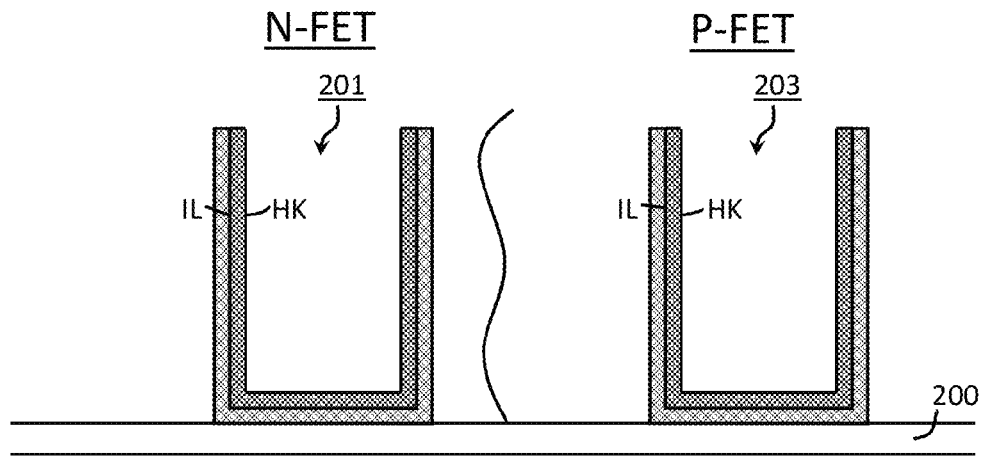
FIGS. 2A through 2F schematically illustrate a lanthanum (La)-based gate stack integration process, in accordance with an exemplary embodiment.

FIG. 2A illustrates IL and HK dielectric layers formed within N-FET and P-FET gate trenches 201 and 203, respectively, on a substrate 200, similar to current RMG process. In one embodiment, the IL may be formed from a Si-based oxide ($SiO_x$) and has a thickness from 8 Å to 12 Å. The HK dielectric layer may, for example, be formed from hafnium oxide ($HfO_2$) and has a thickness from 13 Å to 15 Å. The IL may be formed by a chemical oxidation process or an in-situ steam generation (ISSG) process, and the HK layer may be formed by an atomic layer deposition (ALD) process.

Figure 2B:
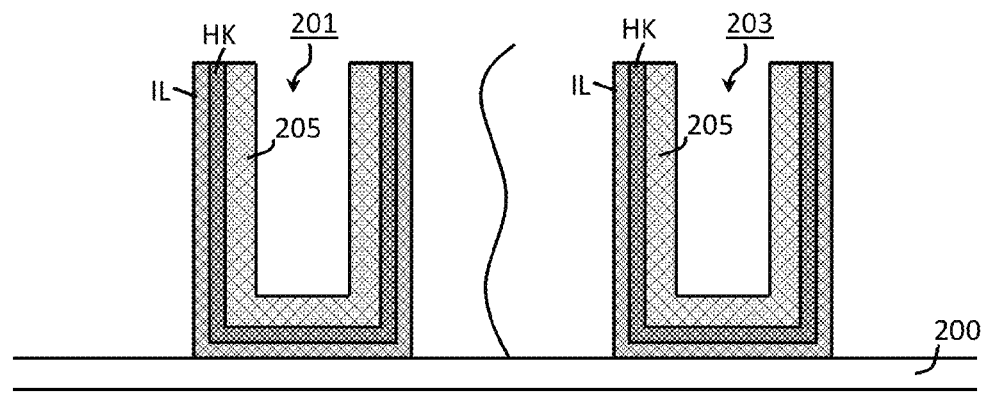

Adverting to FIG. 2B, a pWF metal layer 205 is conformally formed on the HK dielectric layer for both the N-FET and P-FET gate trenches. The pWF metal layer 205 may, for example, include TiN and has a thickness of approximately 50 Å. The pWF metal layer 205 may be formed by an ALD process.

Figure 2C:
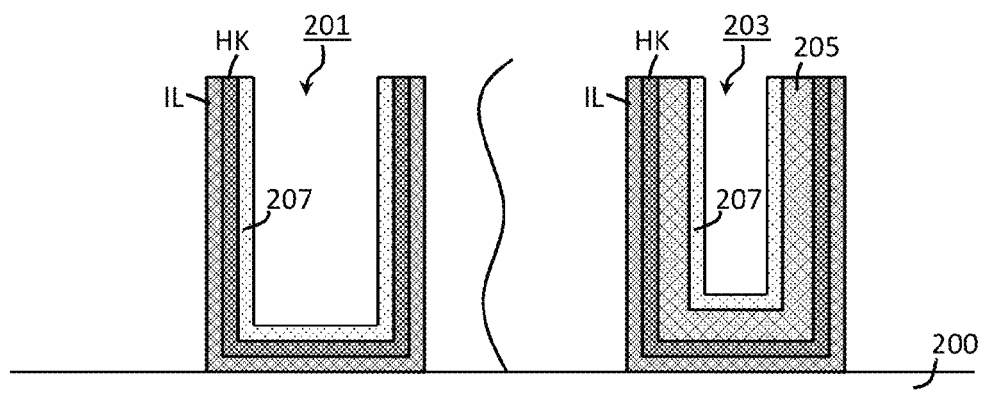

Adverting to FIG. 2C, the pWF metal layer 205 is selectively removed from the N-FET gate trench 201 but is left in place on the P-FET gate trench 203. For example, a patterned etch based on a standard clean 1 (SC1) chemistry process may be used to remove the pWF metal layer from the N-FET gate trench 201. Next, a margin adjusting layer 207, e.g. a $La_2O_3$ layer, is conformally formed on the (now exposed) HK dielectric layer of the N-FET gate trench 201 and on the pWF metal layer 205 of the P-FET gate trench 203. The margin adjusting layer 207 layer may be formed to a thickness ranging from 4 Å to 6 Å.

Figure 2D:
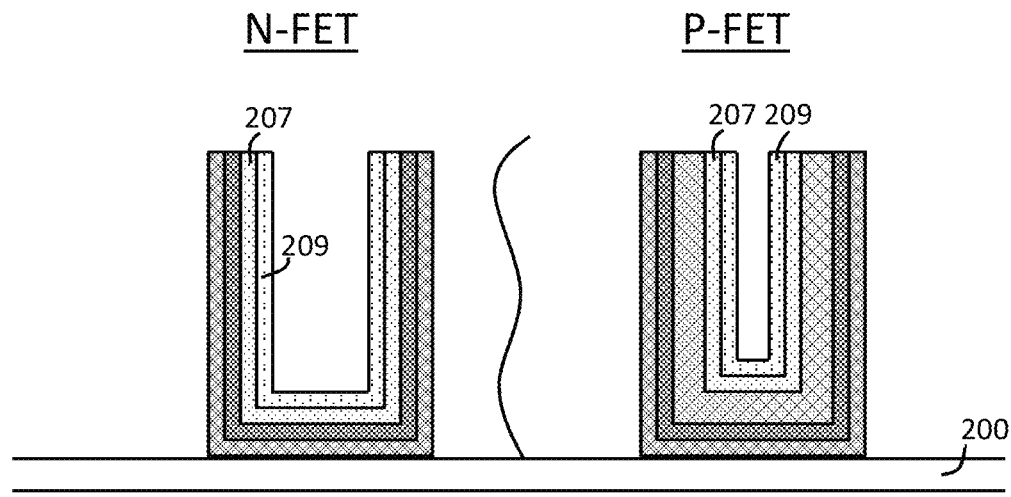

Adverting to FIG. 2D, a metal capping layer 209 is conformally formed on the margin adjusting layer 207 in both the N-FET gate trench 201 and the P-FET gate trench 203. The metal capping layer 209 may be formed from TiN and may have a thickness ranging from 10 Å to 12 Å. The metal capping layer may be deposited by an ALD process.

Figure 2E:
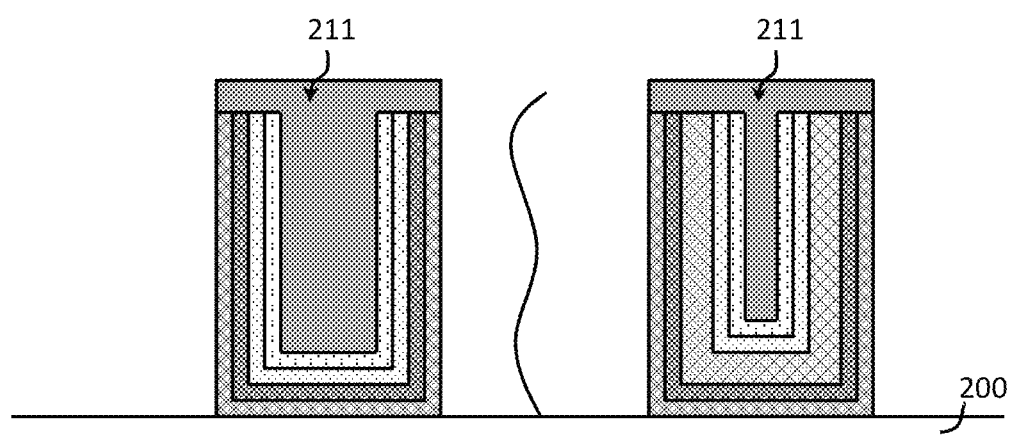

Adverting to FIG. 2E, a Si cap 211 is deposited over both the N-FET gate trench 201 and the P-FET gate trench 203 and is subsequently annealed. The Si cap 211 may, for example, be deposited by a chemical vapor deposition (CVD) process and has a thickness ranging from 100 Å to 200 Å.

Figure 2F:
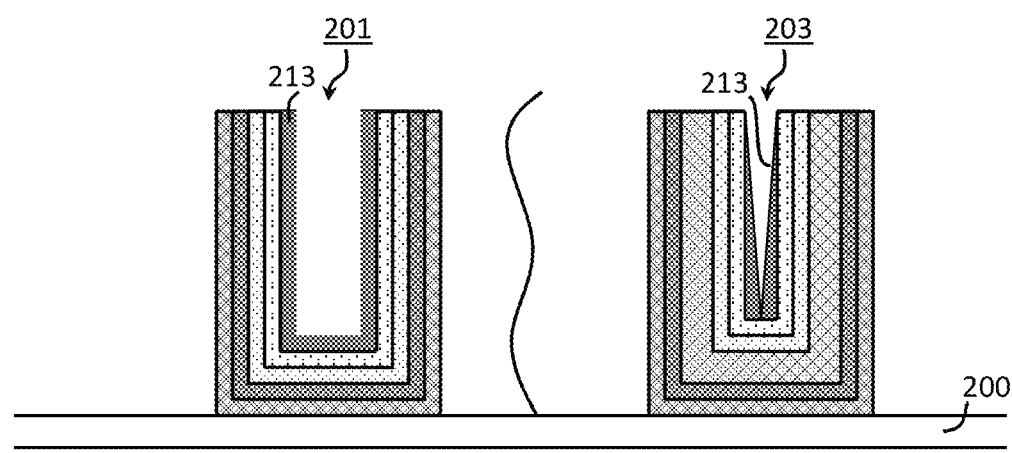

Adverting to FIG. 2F, the Si cap 211 is stripped from both the N-FET gate trench 201 and the P-FET gate trench 203. An ammonium hydroxide ($NH_4OH$) etching process may be used to strip the Si cap 211. Next, an nWF metal layer 213 is conformally formed on the (now exposed) metal capping layer 209 of the N-FET gate trench 201 and of the P-FET gate trench 203. The nWF metal layer 213 may include TiAl and may, for example, be formed by a plasma vapor deposition (PVD) process to a thickness of approximately 60 Å. The thickness of the nWF metal layer 213 in the P-FET device gate trench may be greater near the bottom surface of the trench than at the top without affecting the operation of the resulting P-FET device.

The embodiments of the present disclosure can achieve several technical effects, including additional threshold voltage margin, simplified post gate patterning, and improved gate stack reliability. The present disclosure enjoys industrial applicability in fabricating any of various types of highly integrated semiconductor devices, particularly for 20 nm technology products and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    conformally forming a margin adjusting layer in a first gate trench;
    forming a metal capping layer on the margin adjusting layer;
    forming an n-type work function (nWF) metal layer on the metal capping layer;
    conformally forming a high-K (HK) dielectric layer on a bottom surface and sidewalls of the first gate trench and of a second gate trench;

forming a p-type work function (pWF) metal layer on the HK dielectric layer in the first and second gate trenches;

removing the pWF metal layer from the first gate trench; and forming the margin adjusting layer on the HK dielectric layer in the first gate trench.

2. The method according to claim 1, comprising forming the margin adjusting layer by conformal deposition to a thickness of 4 Angstroms (Å) to 6 Å.

3. The method according to claim 1, comprising forming the metal capping layer of titanium nitride (TiN) by a conformal deposition process to a thickness of 10 Angstroms (Å) to 12 Å.

4. The method according to claim 1, further comprising:
forming the margin adjusting layer on the pWF metal layer in the second gate trench.

5. The method according to claim 4, further comprising:
filling the first and second gate trenches with a silicon (Si) capping layer to a height of 100 Angstroms (Å) to 200 Å above the gate trenches;
annealing the Si capping layer; and
subsequently removing the annealed Si capping layer.

6. The method according to claim 1, comprising forming the nWF metal layer of an nWF material.

7. The method according to claim 1, comprising forming the margin adjusting layer of lanthanum oxide (La2O3).

8. A device comprising:
a margin adjusting layer conformally formed in a first gate trench of a replacement metal gate;
a metal capping layer formed on the margin adjusting layer;
an n-type work function (nWF) metal layer formed on the metal capping layer;
a high-K (HK) dielectric layer conformally formed on a bottom surface and sidewalls of the first gate trench and of a second gate trench,
wherein the margin adjusting layer is formed on the HK dielectric layer of the first gate trench; and
a p-type work function (pWF) metal layer formed on the HK dielectric layer in the second gate trench,
wherein the margin adjusting layer is formed on the pWF metal layer.

9. The device according to claim 8, wherein the margin adjusting layer has a thickness of 4 Angstroms (Å) to 6 Å.

10. The device according to claim 8, wherein the metal capping layer is formed of titanium nitride (TiN) and has a thickness of 10 Angstroms (Å) to 12 Å.

11. The device according to claim 8, wherein the nWF metal layer comprises an nWF material.

12. The device according to claim 8, wherein the margin adjusting layer comprises lanthanum oxide (La2O3).

13. A method comprising:
forming a high-k (HK) dielectric layer on bottom and side surfaces of N-FET and P-FET gate trenches;
forming a p-type work function (pWF) metal layer on the HK dielectric layer;
removing the pWF metal layer from the N-FET gate trench;
conformally forming a margin adjusting layer in the N-FET and P-FET gate trenches;
forming a metal capping layer on the margin adjusting layer;
filling the N-FET and P-FET gate trenches with a silicon (Si) capping layer;
annealing the Si capping layer;
subsequently removing the annealed Si capping layer from the N-FET and P-FET gate trenches; and
forming an n-type work function (nWF) metal layer on the metal capping layer.

14. The method according to claim 13, comprising forming the margin adjusting layer by conformal deposition to a thickness of 4 Angstroms (Å) to 6 Å.

15. The method according to claim 13, comprising forming the metal capping layer of titanium nitride (TiN) by conformal deposition to a thickness of 10 Angstroms (Å) to 12 Å.

16. The method according to claim 13, comprising forming the nWF metal layer of an nWF material.

17. The method according to claim 13, comprising forming the margin adjusting layer of lanthanum oxide (La2O3).

\* \* \* \* \*